(12) United States Patent
Nakajima et al.

(10) Patent No.: US 7,054,879 B2
(45) Date of Patent: May 30, 2006

(54) SYSTEM FOR SUPPORTING REUSE OF HISTORY RECORDS OF DESIGN WORK

(75) Inventors: Hiroshi Nakajima, Okazaki (JP); Hirofumi Itoh, Nagoya (JP); Tai Okubo, Tokyo (JP)

(73) Assignees: Toyota Jidosha Kabushiki Kaisha, Toyota (JP); Nihon Unisys, Ltd., Tokyo (JP)

( * ) Notice: Subject to any disclaimer, the term of this patent is extended or adjusted under 35 U.S.C. 154(b) by 923 days.

(21) Appl. No.: 09/964,421

(22) Filed: Sep. 28, 2001

(65) Prior Publication Data

US 2002/0042705 A1    Apr. 11, 2002

(30) Foreign Application Priority Data

Sep. 29, 2000    (JP)    ............................. 2000-299137

(51) Int. Cl.
G06F 17/30    (2006.01)
(52) U.S. Cl. ...................................... 707/102; 707/203
(58) Field of Classification Search .............. 707/1–10, 707/100–104.1, 200–205; 705/400
See application file for complete search history.

(56) References Cited

U.S. PATENT DOCUMENTS

| | | |
|---|---|---|
| 4,885,694 A | 12/1989 | Pray et al. |
| 5,806,069 A | 9/1998 | Wakiyama et al. |
| 6,081,654 A | 6/2000 | Morman et al. |
| 6,223,092 B1 | 4/2001 | Miyakawa et al. |
| 6,523,027 B1 * | 2/2003 | Underwood .................. 707/4 |
| 6,557,002 B1 | 4/2003 | Fujieda et al. |
| 6,725,184 B1 | 4/2004 | Gadh et al. |
| 6,882,893 B1 | 4/2005 | Uchida et al. |

OTHER PUBLICATIONS

Amor et al., R.W.: "ICAtect-II: a framework for the integration of building design tools," *Automation in Construction*, Elsevier Sci. Publishers, Amsterdam, NL, vol. 8, No. 3 (Feb. 1999), pp. 277-289.

Spooner et al., D.L.: "A data translation tool for engineering systems," *Proc. Int'l Conf. on Data and Knowledge Systs. for Mfg. and Eng'ring*, Gaithersburg (Oct. 16-18, 1989), Los Alamitos, IEEE Comp. Soc. Press, US, vol. Conf. 2, (Oct. 16, 1989), pp. 96-104.

Lees, B. et al., "Case-Based Reasoning Support for Engineering Design," *Proc. SPIE*, vol. 4192, 2000, pp. 394-402.

European Search Report dated Dec. 13, 2005.

* cited by examiner

*Primary Examiner*—Mohammad Ali
(74) *Attorney, Agent, or Firm*—Finnegan, Henderson, Farabow, Garrett & Dunner, LLP

(57) ABSTRACT

In a design support system which can refer to figure element data contained in another design file, when an element ID of figure element data targeted for reference is changed or lost, a CPU retrieves a name allotted to the figure element data by a designer, the figure element data itself, one to which work instruction data matches or one having a high degree of similarity, to specify figure element data targeted for reference in order to provide a design support system which can easily specify a subject to be referenced, improve designing efficiency and enhance overall benefit and convenience.

7 Claims, 4 Drawing Sheets

```
DESIGNATION  OF
WORKING VIEW

"FRONT"

ELEMENT  ID=1

CREATION  OF  COLUMN

RADIUS=aaa

LENGTH=bbb

ELEMENT  ID=2

CREATION OF CUBE
```

SYSTEM FOR SUPPORTING REUSE OF HISTORY RECORDS OF DESIGN WORK

BACKGROUND OF THE INVENTION

1. Field of the Invention

The present invention relates to a design support system which is executed by a computer, namely a CAD system, and more particularly to an improvement in data management.

2. Related Arts

CAD (computer-aided design) generally performs modeling of figures by combining basic figure elements called primitive, or by performing predetermined processing of the primitives as they are or a combination thereof. Specifically, when one edge of a cube is rounded to have a curved shape, a rounding process of that edge is performed with respect to a cube primitive to create a figure. The same figure may be created by another creating process such as extrusion processing (parallel translating body creation) of one quarter of a circle, for example.

As a conventional CAD system, there is known so-called "parametric CAD" which records a drawing procedure such as creation, arrangement, processing, etc. of a primitive as historical data and also relates data of a plurality of figure elements created by the historical data to record and manage as a design file. In the following description, data of figures as a whole having a plurality of figure element data combined is called "figure data".

According to the conventional CAD system, a plurality of figure elements are recorded as separate files, and a design file of each element is related to a base file (standard design file). When designing, the related design file of each element is referenced from the standard design file to divide designers to the respective elements, so that the design management can be facilitated. Thus, the figure data contains a plurality of figure element data.

There is used a system where an ID number is determined for historical data which is referenced in each design file and the figure element data created therefrom, and it is used as a key to retrieve and specify the historical data or the figure element data.

However, according to the aforesaid conventional CAD system, the ID number is sometimes changed or deleted when a design file is converted so to conform to another type of CAD system or optimization processing is performed in order to reduce a load when a design file is stored. Therefore, reference to the historical data or the figure element data is disabled, and it becomes necessary to create a setting for reference again, and when the figure data is comprised of many figure element data, design efficiency lowers, and benefits and convenience are low.

SUMMARY OF THE INVENTION

The present invention was completed in view of the aforesaid circumstances. It is an object of the present invention to provide a design support system which can improve a design efficiency and enhance benefits and convenience.

The present invention is directed to a design support system, which comprises a device for managing a design file formed of a series of work procedure data, which is identified by ID and consists of at least one work procedure data portion, and figure element data to be generated on the basis of each work procedure data portion; a device for recording a work procedure data portion, which corresponds to figure element data to be referenced, as specific information linked with a standard design file by ID for identifying the work procedure data portion when reference from the standard design file to figure element data contained in another design file is determined; a first retrieval device for retrieving a corresponding work procedure data portion within another design file by ID, which is recorded in the specific information, used as a key in order to retrieve the each corresponding work procedure data portion when reference in the standard design file is executed; and a second retrieval device for comparing a work procedure data portion of specific information or figure element data with contents of another design file when a corresponding work procedure data portion is not retrieved by the first retrieval device and retrieving a corresponding work procedure data portion on the basis of the compared result.

The aforesaid specific information is desirably figure data resulting from processing of figure element data targeted for reference or an input pattern of work procedure data.

Besides, the aforesaid second retrieval device desirably retrieves work procedure data targeted for reference with figure data as specific information used as a key, and if work procedure data is not retrieved, retrieves work procedure data targeted for reference with the input pattern of the work procedure data used as a key.

Besides, when the figure data includes a name determined for each of various figure element data by a draftsman, the second retrieval device desirably retrieves figure element data targeted for reference with figure data as specific information used as a key by comparing names determined by the draftsman.

The present invention is also directed to a design support method, which comprises managing a design file formed of a series of work procedure data, which is identified by ID and consists of at least one work procedure data portion, and figure element data to be generated on the basis of each work procedure data portion; recording a work procedure data portion, which corresponds to figure element data to be referenced, as specific information linked with a standard design file by ID for identifying the work procedure data portion when reference from the standard design file to f figure element data contained in another design file is determined; retrieving a corresponding work procedure data portion within another design file by ID, which is recorded in the specific information, used as a key in order to retrieve each corresponding work procedure data portion when reference in the standard design file is executed; and comparing a work procedure data portion of specific information or figure element data with contents of another design file when a corresponding work procedure data portion is not retrieved by the retrieval and retrieving a corresponding work procedure data portion on the basis of the compared result.

DESCRIPTION OF THE PREFERRED EMBODIMENT

Figure 1:
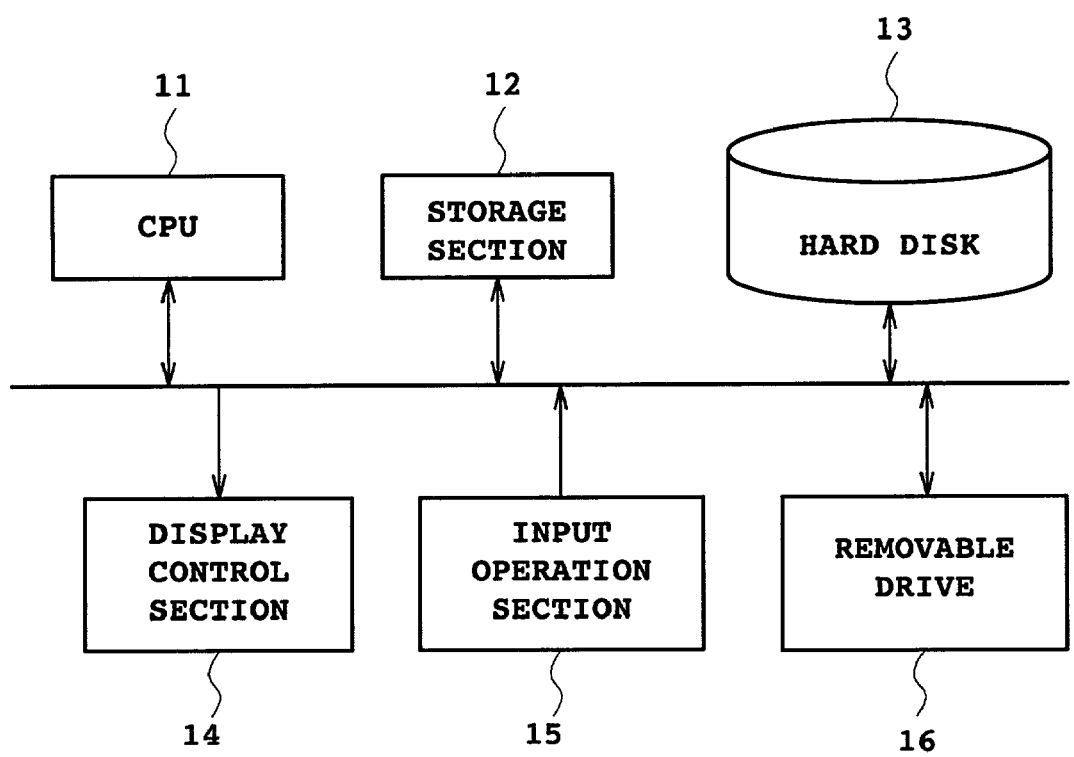
FIG. 1 is a structural block diagram of a design support system according to an embodiment of the present invention.

An embodiment of the present invention will be described with reference to the accompanying drawings. The design support system according to the embodiment of the present invention is basically comprised of a CPU 11, a storage section 12, a hard disk 13, a display control section 14, an input operation section 15 and a removable drive 16 as shown in FIG. 1. The CPU 11 implements a device for managing design files, a device for recording ID in a design file used as a standard, a device for recording specific information, a first retrieval device and a second retrieval device.

Figure 2:
FIG. 2 is an explanatory diagram showing an example of work instruction data.

According to a drawing instruction input from the input operation section 15, the CPU 11 records as work procedure data a working view at a time when the drawing instruction was given and the input drawing instruction in order. The CPU 11 also creates figure element data to be created as a drawing according to the aforesaid drawing instruction, and records the work procedure data and the drawing element data in a related form as a file of the design file in the storage section 12. This work procedure data is specifically the one shown in FIG. 2. In other words, when a figure is created, an element ID is allocated to each figure element data and recorded into every work procedure data corresponding, and an instruction related to the designation of a work environment, such as a change of the working view, is also recorded. Besides, when the designer gives a name to a figure to be created according to each figure element data (e.g., a name such as "cylindrical column 1" is given), this name is included in the figure element data and recorded in the work procedure data.

When the CPU 11 receives as part of the drawing instruction an instruction to refer to the figure element data contained in another design file stored on the hard disk 13, it takes this instruction to refer to work procedure data and records the referenced figure element data as specific information. At this time, it is also desirable that the CPU 11 includes at least any of the names given by the designer, the pertinent figure element data itself or the work procedure data corresponding to the figure element data, in addition to the element ID of the figure element data to be referenced, in the specific information. The specific information is desirably recorded on the hard disk 13 as a file different from the design file to be a standard (the design file to be a standard will be hereinafter called "standard design file"). This is because all figure element data contained in the specific information are not always referenced. In other words, when a plurality of figure element data are contained in the specific information and a work procedure data portion for creating such figure element data is also contained therein, all the work procedure data portions are not always used in the standard design file, so that it is more efficient to record as a separate file. However, where it is not necessary to consider the efficiency or where all the work procedure data portions are referenced, the specific information may be contained and recorded in the standard design file.

In addition, upon receiving input of an instruction to renew the standard design file containing the instruction for referencing, the CPU 11 performs reprocessing of the work procedure data contained in the standard design file to reproduce each figure element data and reconfigures (regenerates) the whole figure data. Here, if a command (substitution command) for instructing recreation of a drawing based on the work procedure data being referenced is input while work procedure data contained in another design file in the work procedure data is being referenced, retrieval processing of the work procedure data is performed, and according to the retrieved drawing instruction, the figure element data is reproduced, and the figure data is recreated.

First, the figure element data retrieval processing by the CPU 11 specifies an element ID of the standard element data being referenced in the work procedure data portion within the specific information. Using the specified element ID as a key, a corresponding work procedure data portion is retrieved from another design file which is newly referenced. Thus, the subjects to be retrieved are narrowed to enhance efficiency. Here, when a corresponding element ID in another design file is changed or lost, work procedure data for a reference targeted for reference is retrieved according to the specific information.

Figure 3:
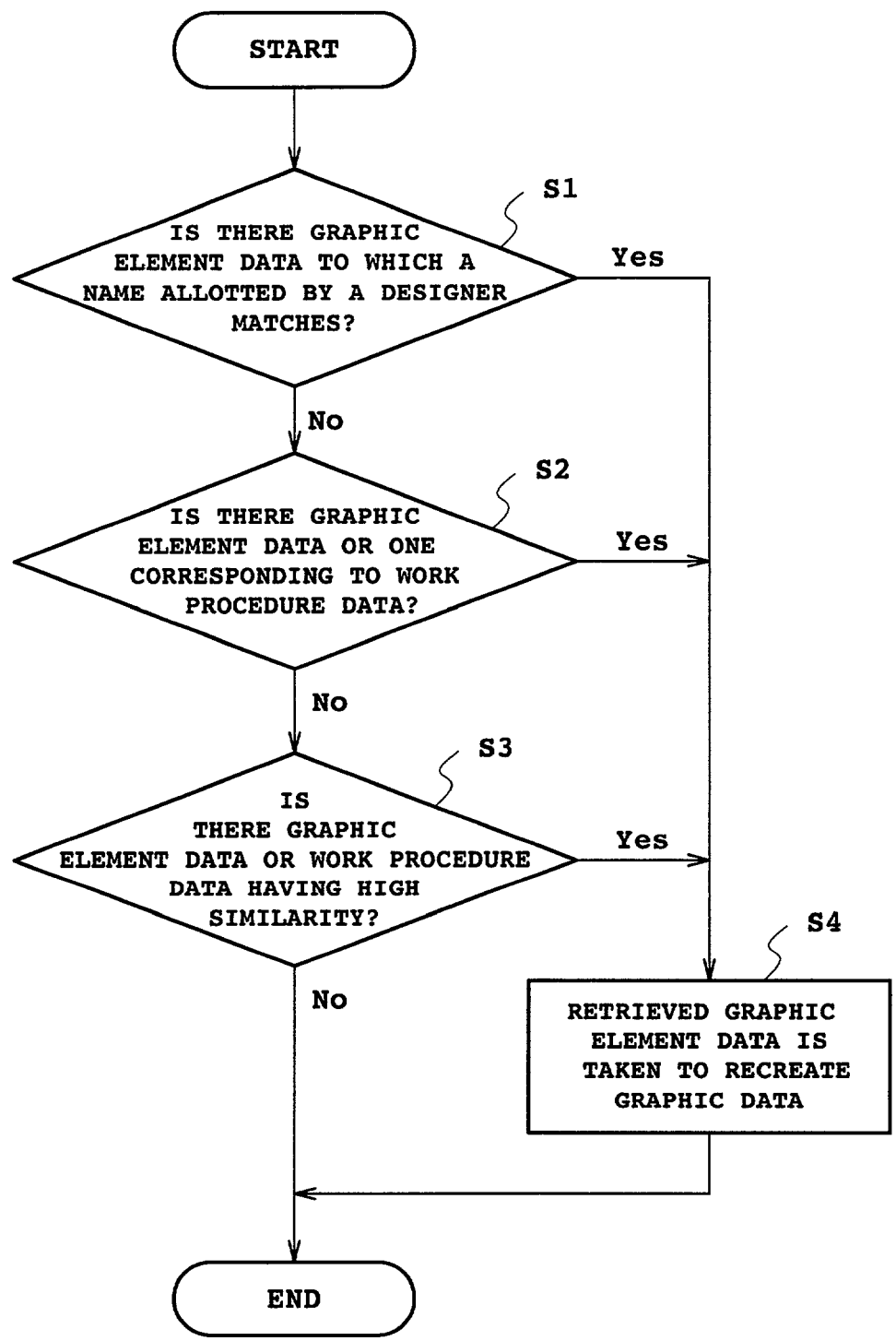
FIG. 3 is a flow chart showing retrieval processing by CPU 11.

Specifically, when a substitution command is input, the CPU 11 retrieves the corresponding work procedure data with reference to the element ID targeted for reference, and when the work procedure data cannot be retrieved by the element ID, the processing shown in FIG. 3 is started to search for figure element data having a name matching the name given by the designer (S1). Here, if there is no figure element data having a matching name (if No), a search is performed for the presence or absence of the recorded figure element data itself or one corresponding to the work procedure data (S2). This step S2 compares, for example, a command (a command designating a primitive of "creation of a cylindrical column" or the like, an instruction command such as "fillet", a "Boolean operation" or the like) included in the work procedure data and its parameter (coordinates, a computation instruction such as "difference", "product" or the like) or compares the figure element data (its shape data, position, coordinates, etc.) to retrieve a matching one.

If there is no matching data found in the step S2 (if No), the CPU 11 checks similarity of the recorded figure element data itself or the work procedure data and retrieves one having a high degree of similarity (S3). The similarity here means, for example, a difference in parameter of the work procedure data, a difference in position of the figure element data, a difference in coordinates, etc. Where the similarity is defined by such a difference, retrieval is performed assuming that one having the smallest difference has a high degree of similarity. In the step S3, it is also appropriate to assume that a similar one has been retrieved only when the similarity is lower than a previously determined threshold value (e.g., only when a difference in parameter is smaller than the predetermined threshold value).

If nothing having a high degree of similarity is found in the step S3 (if No), the processing is terminated. It is also appropriate for the CPU 11 to show a message on the display control section 14 indicating that a substitution object was not found.

Meanwhile, if a matching one or one with high similarity is retrieved in the Step S1, S2 or S3 (if Yes), the retrieved work procedure data is newly recorded as specific information. Also, figure element data is prepared based on the recorded specific information, and figure data as a whole is re-created (S4). Then, the CPU 11 terminates the retrieval processing.

The storage section 12 operates as a work memory of the CPU 11. The hard disk 13 stores and manages the design file as a file based on the instruction from the CPU 11 and reads the design file to output to the CPU 11. The hard disk 13 also stores the program executed by the CPU 11. The display control section 14 is a display or the like and shows figure data or work instruction data on the basis of the instruction from the CPU 11. The input operation section 15 is a keyboard, a mouse or the like from which the CPU 11 receives input of the instruction. The removable drive 16 reads a program from a recording medium which can be read by a computer. The CPU 11 also carries out processing to install the read program on the hard disk 13.

In the aforementioned description, data compared in the step 52 or the step S3 was described as data forming the figure element, but data before and after the aforesaid data, such as a drawing instruction of extension lines previously prepared when the figure element is drawn, are included into the aforesaid data and compared. Besides, in a case of a cylindrical column for example, there are a plurality of creation methods (input patterns) where a circle and extrusion of the circle are instructed with respect to, for example, a cylindrical column creation command in addition to designation of the cylindrical column creation command and parameters of a radius and a length. Therefore, whether the input patterns match or not is also a standard for comparison in the step S2 or the Step 53.

An operation of the design support system of the embodiment will be described. First, it will be described assuming that a design file of the cylindrical column shown in FIG. 4A and the standard design file showing the figure consisting of the cylindrical column and the cube shown in FIG. 4B with reference to the cylindrical column design file are stored on the hard disk 13. For the cylindrical column design file, it is determined that element ID=1, a "circle creation" command and a radius as its parameter are designated, then a "parallel translating body creation" command and a parallel translating length are designated as its parameter, and they are included as work instruction data. Also, data of a figure element (cylindrical column) to be created according to the work instruction data is associated. Here, the figure element data is a solid model and data shown by a well-known boundary representation or the like, but its shape is shown as it is in FIG. 4A, FIG. 4B and FIG. 4C for convenience of description. Here, recording of the specific information into the standard design file will be exemplified.

Referring to the cylindrical column design file, a reference command for referencing the figure element of the element ID=1, specific information comprising work instruction data to be referenced, a command for creating a cube with an element ID=n, and parameters of coordinates at the top and length of the cube are contained as work instruction data in the design file indicating the figure consisting of the cylindrical column and the cube. Also, the figure element data created accordingly is associated. FIG. 4B shows a state where figure data combining the figure element data of the cylindrical column taken for reference and the figure element data of the cubic is stored together with the work instruction data.

Figure 4A:
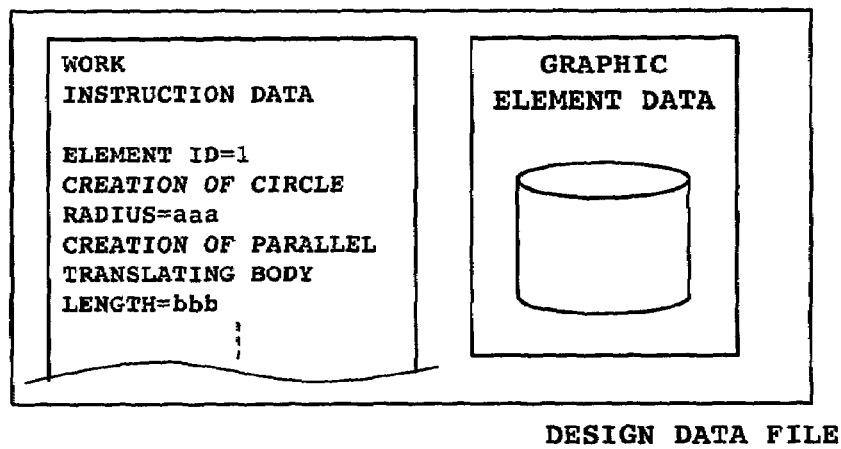
FIG. 4A is an explanatory diagram showing an example of a design data file.
Figure 4B:
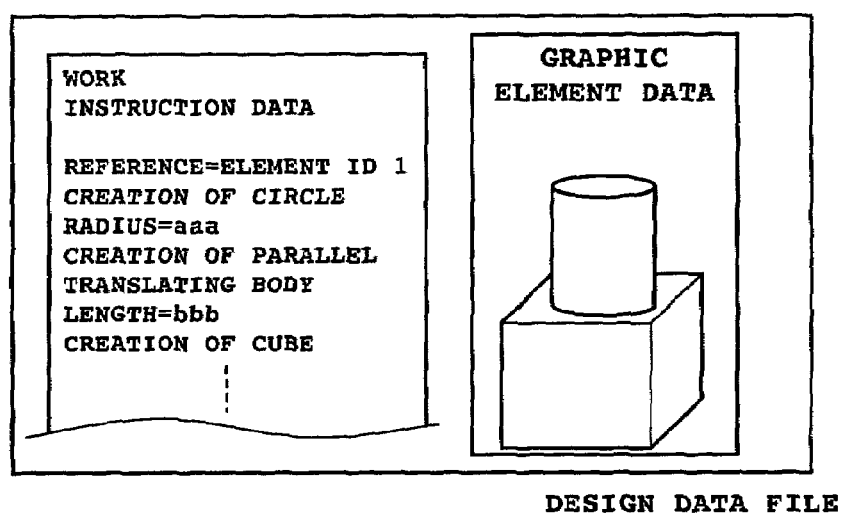
FIG. 4B is an explanatory diagram showing another example of the design data file.
Figure 4C:
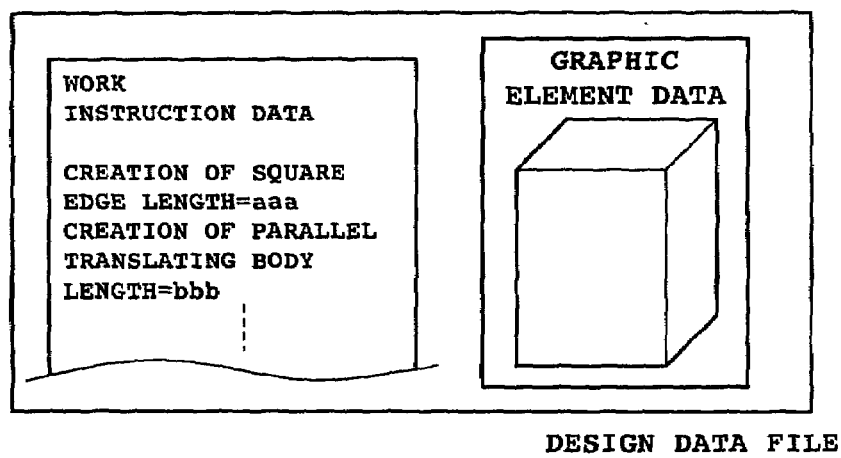
FIG. 4C is an explanatory diagram showing another example of the design data file.

Here, by an operation to convert the file of FIG. 4A into another file format to work, the element ID contained in the work instruction data may be varied or lost. For example, it is assumed that a "circle creation" command is changed to a "square creation" command by another file format and the original cylindrical column shape is changed into a rectangular parallelepiped shape according to the "square creation" and the "parallel translating body creation". In this case, the design file of FIG. 4A has the element ID lost as shown in the design file of FIG. 4C, for example, contains as the work instruction data the "square creation" and "parallel translating body creation" commands and their parameters, and has a state with figure element data of a rectangular parallelepiped shape related. It is assumed that a radius parameter for creating a circle and an edge length parameter for creating the square have the same value and the parameter of a length to the parallel translating body creation command is not changed.

When the designer executes a substitution command while processing the standard design file of FIG. 4B in the aforementioned state, the CPU 11 takes the figure element data corresponding to the element ID=1, but since the element ID has been lost, the processing of retrieving the subject to be referenced shown in FIG. 3 is started. The CPU 11 checks first whether there is a name given by the designer. However, there is no name allotted to the figure element because the work instruction data does not have a name setting work. Therefore, the CPU 11 references the work instruction data or the figure element data itself to search for a matching figure. However, there is no matching figure because the work instruction has been changed from the cylindrical column to the rectangular parallelepiped. The CPU 11 then searches for the work instruction data or the figure element data having a higher degree of similarity. The work instruction data (data shown in FIG. 4C) having a high degree of similarity, which comprises a procedure of creating a two-dimensional shape having a matching value of the parameter with respect to the parallel translating body creation and substantially the same size and translating it to create a column, is retrieved, and according to the retrieved work instruction data, figure element data is re-created, figure data as a whole is re-created, and the re-created results are displayed and stored.

While there has been described that what is at present considered to be a preferred embodiment of the invention, it is to be understood that various modifications may be made thereto, and it is intended that the appended claims cover all such modifications as fall within the true spirit and scope of the invention.

What is claimed is:

1. A design support system, comprising
a device for managing a design file formed of a series of work procedure data, which is identified by ID and consists of at least one work procedure data portion;
a device for recording a work procedure data portion, which corresponds to figure element data to be referenced, as specific information linked with a standard design file by ID for identifying the work procedure data portion when reference from the standard design file to figure element data contained in another design file is determined;
a first retrieval device for retrieving a corresponding work procedure data portion within another design file with ID, which is recorded in the specific information, used as a key in order to retrieve the each corresponding work procedure data portion when reference in the standard design file is executed; and
a second retrieval device for comparing a work procedure data portion of specific information or figure element data with contents of another design file when a corresponding work procedure data portion is not retrieved by the first retrieval device and retrieving a corresponding work procedure data portion on the basis of the compared result;
wherein the specific data includes figure data resulting from processing of figure element data targeted for reference, and an input pattern of work procedure pattern; and
the second retrieval device retrieves work procedure data targeted for reference with figure data as specific information used as a key, and if work procedure data is not retrieved, retrieves work procedure data targeted for reference with the input pattern of the work procedure data itself used as a key.

2. The design assist system according to claim 1, wherein the specific information is figure data resulting from processing of figure element data targeted for reference.

3. The design support system according to claim 1, wherein the specific information is an input pattern of work procedure data.

4. The design support system according to claim 2, wherein: the figure data includes a name determined for each of figure element data by a draftsman; and the second retrieval device retrieves figure element data targeted for reference with figure data as specific information used as a key by comparing names determined by the draftsman.

5. The design support system according to claim 1, wherein: the figure data includes a name determined for each of figure element data by a draftsman; and the second retrieval device retrieves figure element data targeted for reference with the figure data as specific information used as a key by comparing names determined by the draftsman.

6. A design support method, comprising:
   managing a design file, on a design support system, formed of a series of work procedure data, which is identified by ID and consists of at least one work procedure data portion, and figure element data to be formed on the basis of each work procedure data portion;
   recording a work procedure data portion, which corresponds to figure element data to be referenced, as specific information linked with a standard design file by ID for identifying the work procedure data portion when reference from the standard design file to figure element data contained in another design file is determined; said specific information including figure data resulting from processing of figure element data targeted for reference, and an input pattern of work procedure data;
   retrieving a corresponding work procedure data portion within another design to file with ID, which is recorded in the specific information, used as a key in order to retrieve each corresponding work procedure data portion when reference in the standard design file is executed; and
   comparing a work procedure data portion of specific information or figure element data which contents of another design file when a corresponding work procedure data portion is not retrieval and retrieving a corresponding work procedure data portion on the basis of the compared result; said work procedure data being targeted for reference with figure data as specific information used as a key, and if work procedure data is not retrieved, retrieving work procedure data targeted for reference with the input pattern of the work procedure data itself being used as a key.

7. A recording medium storing a design support program and being computer-readable comprising:
   a module for managing a design file formed of a series of work procedure data, which is identified by ID and consists of at least one work procedure data portion, and figure element data to be formed on the basis of each work procedure data portion;
   a module for recording a work procedure data portion, which corresponds to figure element data to be referenced, as specific information linked with a standard design file by ID for identifying the work procedure data portion when reference from the standard design file to figure element data contained in another design file is determined;
   a first retrieval module for retrieving a correspondence work procedure data portion within another design file with ID, which is recorded in the specific information used, as a key in order to retrieve the each corresponding work procedure data portion when reference in the standard design file is executed; and
   a second retrieval module for comparing a work procedure data portion of specific information or figure element data with contents of another design file when a corresponding work procedure data portion is not retrieved by the first retrieval module and retrieving a corresponding work procedure data portion on the basis of the compared result;
   wherein the specific data includes figure data resulting from processing of figure element data targeted for reference, and an input pattern of work procedure pattern; and
   the second retrieval device retrieves work procedure data targeted for reference with figure data as specific information used as a key, and if work procedure data is not retrieved, retrieves work procedure data targeted for reference with the input pattern of the work procedure data itself used as a key.

* * * * *

UNITED STATES PATENT AND TRADEMARK OFFICE
CERTIFICATE OF CORRECTION

PATENT NO. : 7,054,879 B2 Page 1 of 1
APPLICATION NO. : 09/964421
DATED : May 30, 2006
INVENTOR(S) : Hiroshi Nakajima et al.

It is certified that error appears in the above-identified patent and that said Letters Patent is hereby corrected as shown below:

In claim 6, column 7, line 40, "design to file" should read --design file--;

In claim 6, column 7, line 46, "which" should read --with--;

In claim 6, column 8, line 1, "not retrieval and" should read --not retrieved by the retrieval device and--; and In claim 7, column 8, line 23, "correspondence" should read --corresponding--.

Signed and Sealed this

Fourteenth Day of November, 2006

JON W. DUDAS
*Director of the United States Patent and Trademark Office*